United States Patent
Egawa

[11] Patent Number: 5,897,361
[45] Date of Patent: Apr. 27, 1999

[54] SEMICONDUCTOR DEVICE AND METHOD OF PRODUCING SAME

[75] Inventor: Hidemitsu Egawa, Tokyo, Japan

[73] Assignee: Kabushiki Kaisha Toshiba, Japan

[21] Appl. No.: 08/826,746

[22] Filed: Mar. 24, 1997

[30] Foreign Application Priority Data

Mar. 25, 1996 [JP] Japan ................................. 8-068333

[51] Int. Cl.$^6$ ................................................. H01L 21/76
[52] U.S. Cl. ........................ 438/435; 438/424; 438/425; 438/431; 438/437; 148/DIG. 50
[58] Field of Search ...................... 438/424, 427, 438/425, 431, 435, 437

[56] References Cited

U.S. PATENT DOCUMENTS

| | | | |
|---|---|---|---|
| 4,104,086 | 8/1978 | Bondur et al. ............................. | 148/1.5 |
| 4,238,278 | 12/1980 | Antipov .................................... | 156/657 |
| 5,472,904 | 12/1995 | Figura et al. ............................. | 438/427 |
| 5,492,858 | 2/1996 | Bose et al. ............................... | 437/67 |

OTHER PUBLICATIONS

L.K. White et al., "Fusible BPSG Glass Trench Refill Process", David Sarnoff Research Center, 1046b Extended Abstracts; vol. 90/2, Jan. 1, 1990, pp. 406–407.

*Primary Examiner*—Trung Dang
*Attorney, Agent, or Firm*—Finnegan, Henderson, Farabow, Garrett & Dunner, L.L.P.

[57] ABSTRACT

A trench 13 is formed to isolate a first region 11a and a second region 11b where elements of a semiconductor substrate 11 such as a silicon substrate are formed, and a lamination layer of a first silicon oxide layer 14 having a silicon excess stoichiometry ($SiO_x$; 2<x) and a second silicon oxide layer 15 ($SiO_2$) having an equilibrium composition is filled in the trench 13. The second silicon oxide layer is hydrated. In addition, by heating the semiconductor substrate 11, the first silicon oxide layer 14 is oxidized into the second silicon oxide layer 15 ($SiO_2$) having an equilibrium composition. At this time, the first silicon oxide layer 14 has its volume expanded while it is oxidized into the second silicon oxide layer 15 having an equilibrium composition, while the second silicon oxide layer 15 is contracted due to dehydration by the heating treatment and removal of a defective lattice. Therefore, the volume expansion of the first silicon oxide layer 14 is offset by the volume contraction of the second silicon oxide layer 15 to reduce extensively a stress to be applied to the semiconductor substrate 11, so that the silicon oxide layer filled in the trench 13 can be densified.

15 Claims, 4 Drawing Sheets

SEMICONDUCTOR DEVICE AND METHOD OF PRODUCING SAME

BACKGROUND OF THE INVENTION

1. Field of the Invention

The invention relates to a method of producing a semiconductor device, and more particularly to a method of isolating elements of a semiconductor device. In addition, the invention also relates to a semiconductor device which has elements isolated by a trench.

2. Description of the Related Art

Conventional insulating isolation between elements of a semiconductor device was generally made with a relatively thick oxide layer formed by a selective oxidizing method. But, when a thick oxide layer is formed by this method, biting which is referred to as a so-called bird's beak into an element-forming region is made by the oxide layer, and a region required for the insulating isolation of elements is made to have a broader width, resulting in one of the causes preventing a semiconductor device from being highly integrated. Therefore, there has been adopted in recent years a method by which a trench is formed on a silicon substrate, and an insulating material such as $SiO_2$ is particularly filled in the trench to provide isolation between the elements.

One way to provide a highly integrated semiconductor device, it is required to form a trench so deep that a depth becomes several times greater than a width of the trench (an aspect ratio), and the trench is filled with an insulating material such as a silicon oxide layer. Therefore, it has been considered to form an oxide layer by a chemical vapor deposition (CVD) method which provides a good coated form and a CVD method which uses as a material gas an organic silane such as tetraethyl orthosilicate and ozone ($TEOS/O_3$).

But, since the CVD method forms a layer at a relatively low temperature, it is necessary to heat the formed oxide layer at a high temperature of about 1000° C. to densify the layer. Upon heating, the oxide layer filled in the trench is densified and contracted to apply a stress to the silicon substrate on which elements are to be mounted, adversely affecting on the characteristics of a semiconductor device.

To remedy the above-described disadvantage involved in the production method which effects the trench-filling insulating isolation, it has been demanded for an element-insulating isolation step which uses an oxide layer having a good embedding property and insulating property and suffering from a minor volume change while it is heat-treated at a high temperature.

As described above, using an oxide layer formed by the CVD method to embed the trench has a disadvantage of causing a stress in the silicon substrate because the embedded layer is densified and contracted by the high-temperature heating treatment which is performed to improve the layer quality.

The invention has been completed to remedy the above disadvantage, and aims to provide a method of producing a semiconductor device incorporating insulating isolation by embedding a trench, wherein a volume change rate which is caused in an embedded silicon oxide layer while it is being heat-treated at a high temperature is decreased.

SUMMARY OF THE INVENTION

The invention provides a method of producing a semiconductor device having a high reliability by reducing a stress to be applied to a semiconductor substrate when a trench in which an insulating material is filled is formed on the semiconductor substrate to provide insulating isolation between elements.

In addition, the invention provides a semiconductor device having a high reliability by reducing a stress to be applied to a semiconductor substrate when a trench in which an insulating material is filled is formed on the semiconductor substrate to provide insulating isolation between elements.

A first aspect of the invention relates to a method of producing a semiconductor device which comprises a step of forming a trench to provide isolation between a first region and a second region on a semiconductor substrate; a step of depositing a first silicon oxide layer having a silicon excess stoichiometry so that the trench of the semiconductor substrate is filled; a step of removing the first silicon oxide layer formed on the first region and the second region of the semiconductor substrate; and a step of heating the semiconductor substrate so that the excess silicon contained in the first silicon oxide layer is oxidized.

The step to form the trench may form the trench with its depth greater than its width.

In addition, the step to heat the semiconductor substrate may heat the semiconductor substrate in such a way that a volume change rate of the first silicon oxide layer before and after the heating process is about 1% or below. Heating may be performed in an oxidizing atmosphere so that the first silicon oxide layer is oxidized into the silicon oxide layer having an equilibrium composition.

In addition, the first silicon oxide layer may be formed by a CVD method using, for example, an $SiH_4$ gas as a material gas.

A second aspect of the invention relates to a method of producing a semiconductor device which comprises a step of forming a trench to provide isolation between a first region and a second region on a semiconductor substrate; a step of depositing a lamination layer of a first silicon oxide layer having a silicon excess stoichiometry and a second silicon oxide layer having an equilibrium stoichiometry on the semiconductor substrate so that the trench of the semiconductor substrate is filled; a step of removing the first silicon oxide layer and the second silicon oxide layer formed on the first region and the second region of the semiconductor substrate; and a step of heating the semiconductor substrate so that the excess silicon contained in the first silicon oxide layer is oxidized.

The step to deposit the second silicon oxide layer is characterized by accumulating a hydrated silicon oxide layer. Water contained in the second silicon oxide layer can be used as an oxygen supply source in the heating process to oxidize the first silicon oxide layer having a silicon excess stoichiometry into the silicon oxide layer having an equilibrium composition.

In addition, in the heating process, oxygen for oxidizing the first silicon oxide layer may be supplied from the heating atmosphere so that the second silicon oxide layer is supplied in a diffused form.

In addition, the step to deposit the second silicon oxide layer may accumulate the second silicon oxide layer in such a way that a water content becomes about 1% or below. By controlling the water content of the second silicon oxide layer, expansion by the oxidization of the first silicon oxide layer and contraction by the dehydration of the second silicon oxide layer and the removal of a defective lattice are well-balanced, so that a stress to be applied to the semiconductor substrate can be reduced.

A third aspect of the invention relates to a semiconductor device which comprises a semiconductor substrate having a first region and a second region, the semiconductor substrate having a trench formed on the boundary between the first region and the second region so that the trench isolates the first and the second region each other; and a lamination layer of a plurality of silicon oxide layers formed along the wall of the trench so that the trench of the semiconductor substrate is filled.

In addition, a silicon nitride layer may be formed on the first region and the second region of the semiconductor substrate where elements are formed excepting the trench.

In addition, a ratio of the opening width to depth of the trench may be greater than 1.

Generally, the method of producing a semiconductor device of the invention comprises the following steps. First, a trench is formed on a semiconductor substrate, a silicon oxide layer having a silicon excess stoichiometry ($SiO_x$; $0<X<2$, hereinafter simply called $SiO_x$) having a non-equilibrium stoichiometry is deposited in the trench by a CVD method, and the needless $SiO_x$ layer is removed excepting from the trench. By heating the $SiO_x$ layer filled in the trench at a high temperature of about 1000° C. in an oxidizing atmosphere to change $SiO_x$ into $SiO_2$ having an equilibrium composition, a dense $SiO_2$ layer can be filled in the trench without producing a stress.

By heating the $SiO_x$ layer having a silicon excess stoichiometry at a high temperature in an oxidizing atmosphere, its oxidization is progressed to absorb oxygen, and it is changed to $SiO_2$ having an equilibrium composition. The $SiO_x$ layer has a property to expand its volume through this process. On the other hand, when $SiO_2$ having an equilibrium composition is heated at a high temperature in an oxidizing atmosphere, its volume is contracted because the layer is densified but the volume is not expanded by absorbing oxygen. Thus, since $SiO_x$ and $SiO_2$ have a contrary tendency in view of the volume change in the high-temperature heating treatment, the volume change rate can be suppressed to 1% or below in the process that $SiO_x$ is changed to $SiO_2$ having an equilibrium composition and an effect of distortion can be eliminated substantially by controlling the high-temperature heat treating temperature and duration, the $SiO_x$ composition, and the supplied amount of oxygen in the atmosphere in which the heating treatment is performed.

In addition, as a method to supply oxygen to the $SiO_x$ layer filled in the trench, after the $SiO_x$ layer is deposited in the trench by the CVD method, a hydrated $SiO_2$ layer is successively deposited on the $SiO_x$ layer, or the $SiO_x$ layer and the hydrated $SiO_2$ layer are alternately deposited on the trench for the number of multiple times, the lamination layer of $SiO_x$ and $SiO_2$ is removed excepting from the trench, and the high-temperature heating treatment is performed, so that a dense $SiO_2$ layer can be filled in the trench without producing any stress. In this process, it is preferable to control the water content of the silicon oxide layer having an equilibrium composition to less than 1%. The water content of the silicon oxide layer with an equilibrium composition is defined as a ratio of an H—O—H bond to an Si—O bond.

Water content=(Number of H—O—H bonds/Number of Si—O bonds) (%)

This water content, namely a ratio of the numbers of bonds, can be measured by, for example, an FTIR (Fourier transform infrared spectroscopy).

At this time, oxygen is supplied to the $SiO_x$ layer from the water content in the hydrated $SiO_2$ layer with an equilibrium composition as a supply source. $SiO_2$ contracts due to the discharge of the water content (dehydration), and the $SiO_x$ layer having a silicon excess stoichiometry is expanded by being oxidized through the discharged water content. Therefore, a volume change which induces a stress in the heating treatment does not take place. Accordingly, the heating treatment here does not need the oxidizing atmosphere, and the water content in $SiO_2$ provides an environment of oxidizing $SiO_x$.

In the configuration of the lamination layer of $SiO_x$ and $SiO_2$ filled in the trench, it is not always necessary to hydrate the $SiO_2$ layer, but the heating treatment in an oxidizing atmosphere can supply oxygen to $SiO_x$ through $SiO_2$.

The $SiO_2$ layer grown at a relatively low temperature by the CVD method has a layer quality of a relatively low density (crude) and a sufficiently high diffusion coefficient of oxygen, and oxygen contained in the atmosphere is quickly diffused through the $SiO_2$ layer and supplied to $SiO_x$.

DESCRIPTION OF THE PREFERRED EMBODIMENTS

First Embodiment

FIG. 1A, FIG. 1B, FIG. 1C, and FIG. 1D are diagrams illustrating a method of producing a semiconductor device according to the invention, schematically showing cross sectional structures of a semiconductor device.

Figure 1A:
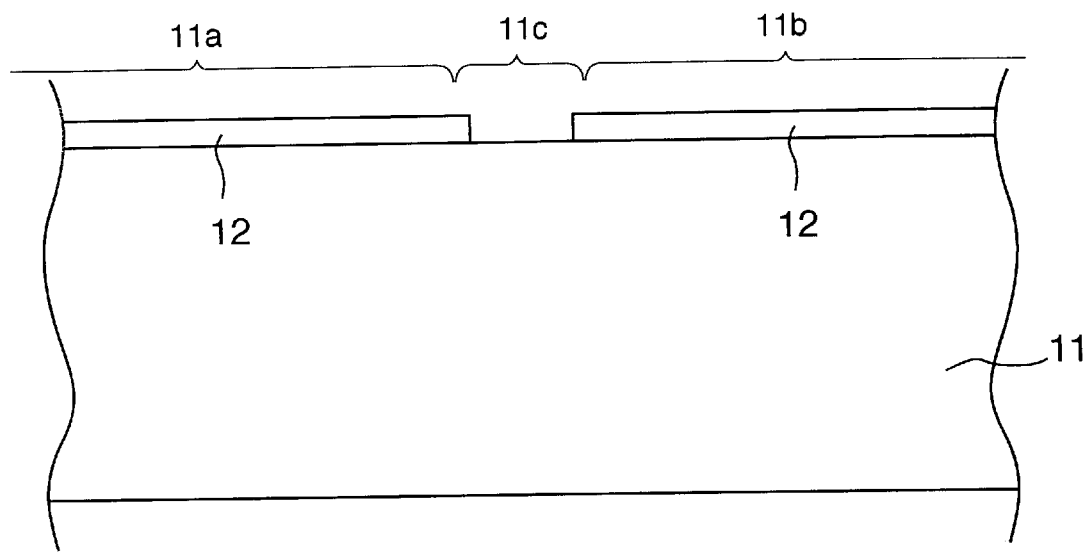
FIG. 1A, FIG. 1B, FIG. 1C, and FIG. 1D are diagrams illustrating a method of producing a semiconductor device according to the invention.

As shown in FIG. 1A, the surface of a semiconductor substrate 11 formed of, e.g., p-type silicon is covered with a protective layer 12 which is formed of a silicon heat-oxide layer, a silicon nitride layer, or a lamination layer of such films and polysilicon. In addition, the protective layer 12 formed on an element isolating region 11c for providing isolation between a first region 11a and a second region 11b on which elements will be formed in a post-process is selectively etched and removed.

Description will be made of an embodiment of using a p-type silicon substrate, but the invention is not limited to such an embodiment and can also be applied to a semiconductor device using another semiconductor substrate.

Figure 1B:
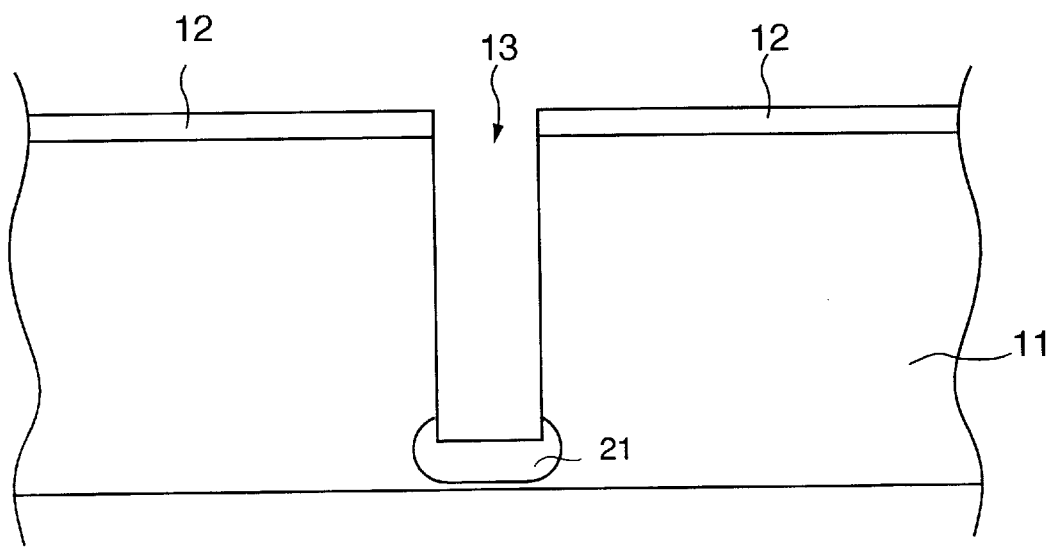

Using the protective layer 12 as a mask, reactive ion etching (RIE) is performed with a chlorine-based gas such as $Cl_2$, and a trench 13 is formed on the element isolating region 11c. The formed trench 13 had dimensions of 0.35 μm wide and 0.8 μm deep. In addition, to reduce a leakage current between the first region 11a and the second region 11b, B (boron) ions are implanted into the bottom of the trench 13 (FIG. 1B).

Figure 1C:
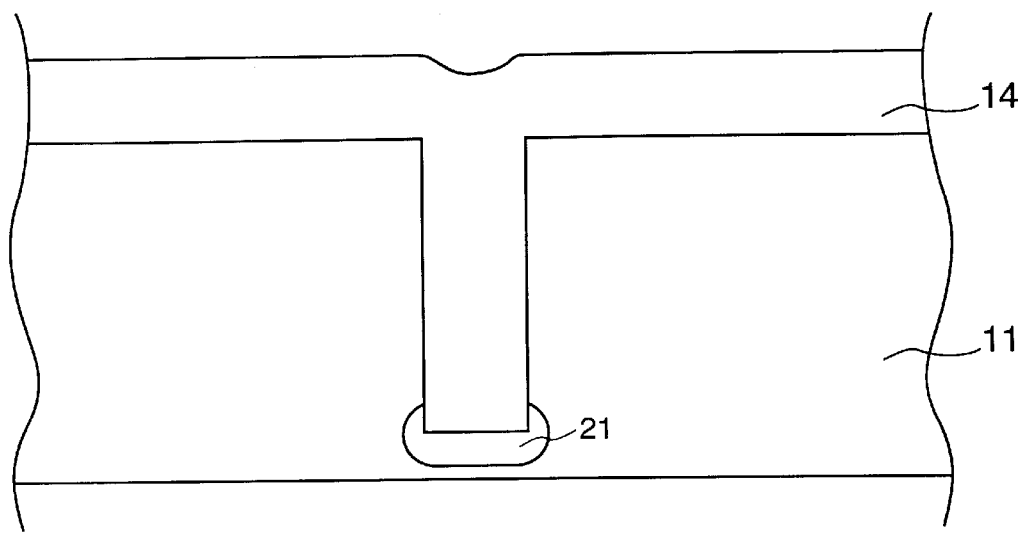

Then, as shown in FIG. 1C, a silicon oxide layer $SiO_x$ 14 having a silicon excess stoichiometry (($Si/O$)>0.5) is deposited by a plasma CVD method to fill the trench 13. At this time, the oxide layer 14 on the surface of the semiconductor substrate 11 had a thickness of about 1.5 $\mu$m.

The plasma CVD method was performed under conditions that the material gases $SiH_4$ and $O_2$ had a flow rate of 10 cc/min and 100 cc/min respectively, a plasma chamber had an inner pressure of 1 Torr or lower, and a layer forming temperature was about 300° C. The obtained $SiO_x$ layer 14 had a composition X=1.2 ((Si/O)=0.83). The material gas may be organic silane such as TEOS in addition to inorganic silane such as $SiH_4$, and oxidizing gas may be any type such as $O_2$, $O_3$ or $N_2O$. But, $SiH_4/O_2$-based material gases are preferably used from a viewpoint of not using an element such as C or N which may cause a defective crystal in the silicon substrate.

To enhance the integration of a semiconductor device, the trench 13 formed for the element isolation is required to have a high aspect ratio in that the ratio of a depth D to an open width W is high. But, if the trench 13 has a narrow width w and a deep depth d, it is hard to fill the trench. Because, the $SiO_x$ layer 14 being deposited by the CVD method overflows the trench to gradually form an overhanged shape to close the opening of the trench while forming the layer, resulting in forming a void 16 inside the trench. The void 16 forms a serious hindrance to the progress of the succeeding production process, and also affects adversely on the reliability of a semiconductor device produced. Therefore, it is necessary to prevent the void 16 from being formed.

The void 16 can be prevented from being formed by incorporating a method of applying a bias to the silicon substrate 11 when the $SiO_x$ layer 14 is formed in the trench 13 by the plasma CVD method. In this embodiment, an etching efficiency was enhanced by charging Ar gas having a flow rate of about 100 cc/min in addition to $SiH_4$ and $O_2$ into the chamber, and applying a bias power of about 100 W. Thus, by performing the $SiO_x$ layer forming and the bias etching at the same time, the $SiO_x$ layer can be grown on the inner wall of the trench 13 while removing the overhang formed on the opening of the trench 13, so that the void 16 can be prevented from being formed in the trench 13.

The $SiO_x$ layer 14 forming and the bias etching can be performed at the same time, but the $SiO_x$ layer 14 forming and the bias etching can be performed alternately by varying the plasma conditions. Switching between the layer forming and the etching can be effected by employing a method of alternately switching the bias conditions for example. If the trench depth d becomes two times or more of the trench width w, the trench 13 can be filled better by employing the plasma CVD method and the bias etching in combination.

To reveal the element forming regions 11a, 11b on the surface of the p-type silicon substrate 11, the $SiO_x$ layer 14 deposited on the first region 11a and the second region 11b of the silicon substrate 14 was removed with the $SiO_x$ layer 14 remained in the trench 13.

Figure 1D:
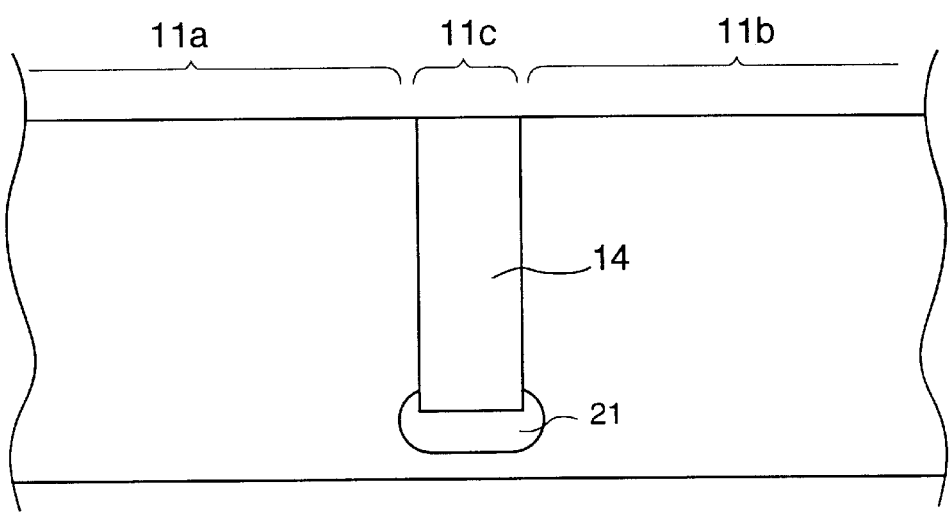
Figure 2:
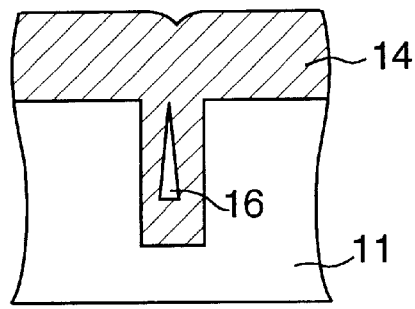
FIG. 2 is a sectional view showing a process that a void is formed in an oxidized layer embedded in an element isolating region.

The $SiO_x$ layer 14 can be removed by effecting etch back according to an RIE or by an ordinary wet etching. But, as shown in FIG. 1D, to secure flatness of the element forming regions 11a, 11b and the $SiO_x$ layer 14 remained in the trench 13 and to provide a good embedded shape, it is preferable to adopt a CMP (chemical mechanical polishing) method.

Figure 3:
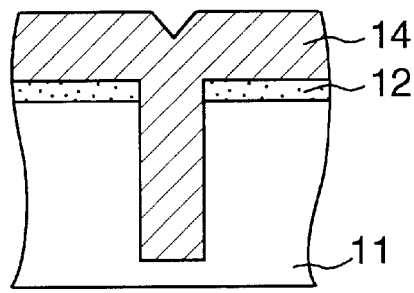
FIG. 3 is a sectional view showing a process of embedding an oxide layer with a protective layer used to form a trench remained.

To polish by the CMP method, it is more preferable that the protective layer 12 is formed of a silicon nitride layer $SiN_x$, and the $SiO_x$ layer 14 is deposited in the trench 13 without removing the protective layer 12 as shown in FIG. 3. When the $SiO_x$ layer 14 is polished, the reveal of the protective layer 12 can be used to detect the completion of polishing by utilizing hardness of the SiN layer. In addition, when the element forming regions are covered with the hard SiN layer, a flaw having serious effects on the element properties can be prevented from being formed on the surfaces by the polishing process.

After the above-described process, the semiconductor substrate 11 is heated so that the $SiO_x$ layer 14 remained in the trench 13 is oxidized into an $SiO_2$ layer excelling in insulation and the B ions implanted into the bottom region 21 of the trench 13 to reduce a leakage current. This heating treatment was performed in an oxidizing atmosphere at about 1000° C. Generally, a single heat treating process can oxidize the deposited $SiO_x$ layer into the $SiO_2$ layer and activate the B ions implanted by the ion implanting method or the like.

Since the $SiO_x$ layer 14 filled in the trench 13 which is formed on the element isolating region 11c is the silicon oxide layer having a silicon excess stoichiometry, the excessive silicon is oxidized by the heating treatment in the oxidizing atmosphere at about 1000° C., and its volume is expanded in the trench 13. On the other hand, the oxidized $SiO_2$ layer has its defects removed by the heating treatment and its volume is densified by being contracted.

Figure 4:
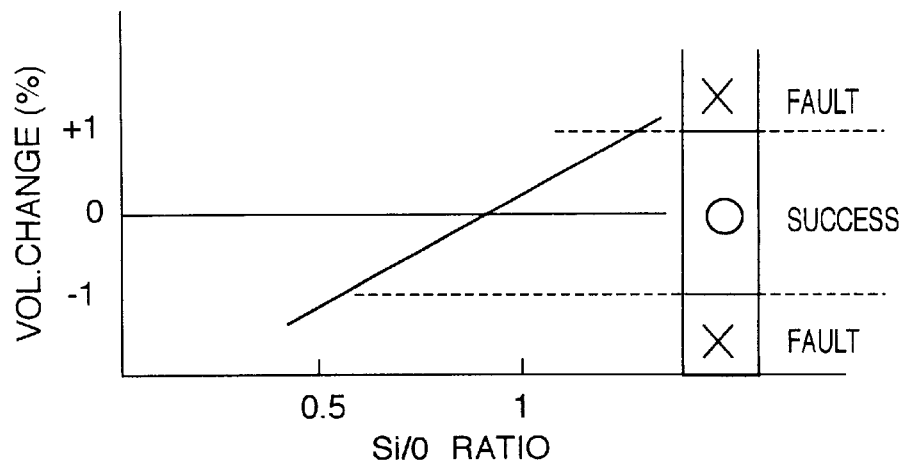
FIG. 4 is a diagram showing the relation between a composition ratio of a silicon oxide layer having a silicon excess stoichiometry and a volume change rate at about 1000° C.

FIG. 4 shows the relation between a composition ratio Si/O (corresponding to 1/X) of a silicon oxide layer having a silicon excess stoichiometry and its volume change in the high-temperature heating treatment. The volume change rate can be suppressed to 1% or below by determining the composition ratio Si/O of the silicon oxide layer having a silicon excess stoichiometry to a range of 1.0/1.8 or more to 1.0/0.8 or below. Therefore, a stress to be caused in the semiconductor substrate 11 can be reduced, and the characteristics of the semiconductor device can be improved.

Accordingly, the $SiO_x$ layer filled in the trench 13 has its effects of expansion and contraction canceled mutually by the high-temperature heating treatment and is changed to the dense $SiO_2$ layer having a good insulating isolation property. The volume change rate at this time can be converged on a small value of 1% or below by optimizing the above-described process conditions.

When the volume change rate of the insulating layer filled in the trench 13 exceeds 1%, the semiconductor substrate 11 suffers from a defective lattice or a change in interfacial level, resulting in deteriorating the respective elements configuring the semiconductor device and the characteristics of the semiconductor device as the whole. Therefore, it is significant to suppress the volume change rate of the insulating layer filled in the trench 13 to 1% or below in order to obtain good element characteristics and semiconductor device characteristics.

In addition, since a residual stress which is caused in the semiconductor substrate 11 can also be decreased by suppressing the volume change rate, the characteristics of a semiconductor device which is formed of the semiconductor substrate 11 can be suppressed from being varied with time, and the reliability of the semiconductor device can be improved.

Second Embodiment

Figure 5A:
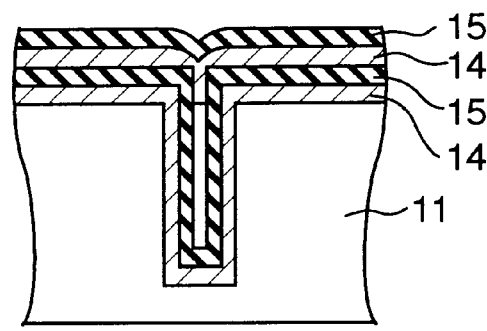
FIG. 5A and FIG. 5B show another embodiment of the method of producing a semiconductor device according to the invention.
Figure 5B:
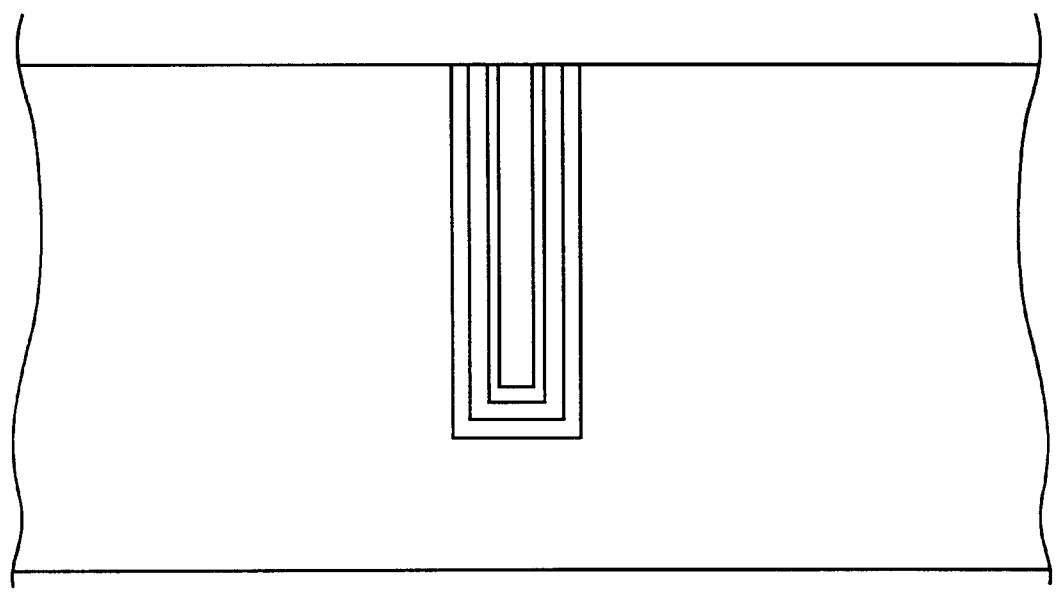

FIG. 5A and FIG. 5B show another embodiment of the method of producing a semiconductor device according to the invention.

Description will be made of an example of using a lamination layer of a silicon oxide layer having a silicon excess stoichiometry and a silicon oxide layer having an equilibrium composition as the insulating material to be filled in the trench.

The process up to the formation of the trench 13 is identical with the one in the first embodiment.

After forming the trench 13 on the element isolating region 11c of the semiconductor substrate 11, the $SiO_x$ layer 14 having a silicon excess stoichiometry and the $SiO_2$ layer 15 having an equilibrium composition are formed to fill the trench 13. At this time, the layer depositing and the bias etching may be combined to prevent the void 6 from being formed due to the overhang as described above.

FIG. 5A shows that the $SiO_x$ layer and the $SiO_2$ layer are alternately formed on the semiconductor substrate 11, and the trench 13 is completely filled with the lamination layer of $SiO_x$ and $SiO_2$. The $SiO_2$ layer 15 which was lastly formed is not filled in the trench but substantially uniformly deposited on the element isolating region 11c and the element forming regions 11a, 11b.

As shown in FIG. 5A, the trench 13 on the semiconductor substrate 11 is fully filled with the lamination layer of the $SiO_x$ layer 14 and the $SiO_2$ layer 15, then the surface of the semiconductor substrate 11 is exposed. In other words, the lamination layer formed on the element forming regions 11a, 11b is removed by a CMP method or the like with the lamination layer of $SiO_x$ 14 and $SiO_2$ 15 remained in the trench 13. At the element isolating region 11c of the semiconductor substrate 11, the end face of the lamination layer of the $SiO_x$ 14 and the $SiO_2$ 15 charged in the trench 13 is exposed as shown in FIG. 5B.

After removing the $SiO_x$ layer 14 and the $SiO_2$ layer 15 which were formed on the element forming regions 11a, 11b, the lamination layer of the $SiO_x$ layer 14 and the $SiO_2$ layer 15 filled in the trench 13 is heated in an oxidizing atmosphere at about 1000° C.

Since the $SiO_2$ layer 15 deposited by the CVD method has a coarse layer property, oxygen contained in the atmosphere is quickly dispersed into the trench along the $SiO_2$ via the end face of the lamination layer exposed on the insulating isolation region 11c. At this time, oxygen is also introduced into the $SiO_x$ layer 14 having a silicon excess stoichiometry and reacted with the excessive oxygen, so that the dispersion of oxygen along the $SiO_x$ layer 14 involves the reaction, and its diffusion rate is slower than that into the coarse $SiO_2$ layer 15.

Thus, by introducing oxygen contained in the atmosphere into the $SiO_x$ layer 14 via the $SiO_2$ layer 15, the lamination layer of the $SiO_x$ layer 14 and the $SiO_2$ layer 15 filled in the trench 13 can be modified into a dense $SiO_2$ layer while its volume change is suppressed to a minimum.

The lamination layer of the $SiO_x$ layer 14 and the $SiO_2$ layer 15 can be deposited by switching the layer forming conditions such as an oxygen partial pressure, a temperature and the like by the plasma CVD between the layer forming conditions for the $SiO_x$ layer 14 and the layer forming conditions for the $SiO_2$ layer 15 having an equilibrium composition in the CVD method using a gas mixture of $SiH_4$ and $O_2$ as a material. In addition, a plurality of CVD devices may be used so that the $SiO_2$ layer 15 is deposited by the ordinary CVD method using another oxygen supply source (oxygen reservoir) such as $N_2O$, and the $SiO_x$ layer 14 is deposited by another plasma CVD device. The lamination layer may be deposited starting from the $SiO_x$ layer 14 or the $SiO_2$ layer 15. In addition, the lamination layer preferably has two or more layers.

When a hydrated $SiO_2$ layer is formed in preparing the lamination layer of the $SiO_x$ layer 14 and the $SiO_2$ layer 15, the high-temperature heating treatment can be a simple heating treatment because oxygen is supplied to the $SiO_x$ layer 14 through water contained in the $SiO_2$ layer 15 in the lamination layer, and it is not necessary to supply oxygen from the atmosphere.

Since the water is uniformly distributed along the layer surface of the hydrated $SiO_2$ layer 15, oxygen is supplied with high uniformity to the $SiO_x$ layer 14 through water in the direction of the depth of the lamination layer filled in the trench 13. With water discharged from the $SiO_2$ layer 15, the $SiO_2$ layer 15 is contracted, while the $SiO_x$ layer 14 is expanded with oxygen supplied to the $SiO_x$ layer 14. By this method, the volume change rate of the lamination layer filled in the trench 13 can be suppressed to 1% or below. In addition, the lamination layer of the $SiO_x$ layer 14 and the $SiO_2$ layer 15 can be modified to an $SiO_2$ layer which is dense and good in insulation.

Stoichiometry of the $SiO_x$ layer 14 becomes close to the equilibrium composition ($SiO_2$) by oxygen supplied from the atmosphere or the hydrated $SiO_2$ layer 15 during the heating treatment, but may not be a complete equilibrium composition. In this case, the structure of the lamination layer of the $SiO_x$ layer 14 and the $SiO_2$ layer 15 filled in the trench 13 may not disappear completely.

To contain water into the $SiO_2$ layer having an equilibrium composition, organic silane such as TEOS may be added when the $SiO_2$ layer 15 is deposited in the trench 13. This method can freely vary the water content in the $SiO_2$ layer 15 in a range of not exceeding 1% by adjusting the depositing temperature. In addition, with this water content range, the volume change rate while the lamination layer of the $SiO_x$ layer 14 and the $SiO_2$ layer 15 is modified to the uniform and dense $SiO_2$ layer can be suppressed to 1% or below. The water content here was determined by measuring as a ratio of the number of bonds between an Si—O bond and an H—O—H bond of the formed $SiO_2$ layer 15 having an equilibrium composition by an FTIR method The volume change rate in the heating treatment is variable depending on the duration of the high-temperature heating treatment and the gas composition and concentration in the oxidizing atmosphere, but the flexibility of the heating treatment conditions is reduced when the high-temperature heating treatment and the heating treatment to activate B implanted into the trench bottom are performed simultaneously.

Since the flexibility of the heat treating conditions is enhanced extensively by forming the $SiO_x$ layer 14 and the $SiO_2$ layer 15 into a lamination layer as in the present invention, an insulating material to be filled in the trench 13 can be made uniform and given high quality and the ions implanted for improving the separation property of the trench 13 can be activated by a single heating treatment. Therefore, a thermal load to the semiconductor substrate can be decreased, and productivity can be improved.

The high-temperature heating treatment at about 1000° C. (800° C. to 1300° C.) is specifically performed by the following method.

First, a heat-treating furnace is set to a temperature of about 800° C., and the semiconductor substrate 11 which has the insulating material such as the silicon oxide layer 14 having a silicon excess stoichiometry filled in the trench 13 is placed in the furnace. The silicon substrate 11 is placed in the heating furnace at such a relatively low temperature to prevent a defective crystal from being formed in the silicon substrate 11 due to a sharp temperature rise from room temperature to the heat treating temperature.

Then, the heat treating furnace is set to an optimum temperature for the subject semiconductor substrate 11 in a range of about 800° C. to about 1300° C. The optimum temperature may be varied according to various conditions such as the trench shape and an Si-to-O ratio in the $SiO_x$ layer 14 filled in the trench 13. In addition, when the lamination layer of the $SiO_x$ layer 14 having a silicon excess stoichiometry and the $SiO_2$ layer 15 having an equilibrium composition is filled in the trench 13, the heat treating temperature may be varied depending on the structure of the lamination layer.

Into the heat treating furnace, oxidizing gas such as $O_2$ or $H_2O$ is previously flown at a given flow rate to provide the oxidizing atmosphere for the heating treatment of the silicon substrate. When $O_2$ is used, it is diluted to 10% to 50% with, for example, nitrogen. In addition, when $H_2O$ is used, hydrogen burning oxidation is performed, and this can be combined with the oxidation with $O_2$. Thus, the high-temperature heating treatment is performed in the oxidizing atmosphere with the $O_2$ or $H_2O$ partial pressure controlled at the optimum temperature for about 30 minutes to three hours.

It has been described that the protective layer 12 in FIG. 1A is used to protect the element forming regions 11a, 11b. In addition, the element forming regions 11a, 11b can also be prevented thoroughly from being oxidized in the high-temperature heating treatment in the oxidizing atmosphere by remaining the protective layer 12 formed of SiN as it is.

When the semiconductor substrate 11 such as a silicon substrate is to be taken out of the furnace after completing the high-temperature heating treatment, the heat treating furnace is reduced from the optimum set temperature to 800° C. Thus, a defective lattice can be prevented from being formed in the semiconductor substrate 11 due to a sharp temperature change. As described above, when the lamination layer of the hydrated $SiO_2$ layer 15 and the $SiO_x$ layer 14 is subjected to the high-temperature heating treatment, the partial pressure control of $O_2$ or $H_2O$ in the oxidizing atmosphere is not required, so that the configuration of the heat treating furnace can be simplified extensively. In addition, to contain water into the $SiO_2$ layer 15, the $SiO_2$ layer 15 may be exposed to steam for a given time after forming the $SiO_2$ layer 15.

Thus, according to the present invention, densifying can be performed while the volume change rate of the silicon oxide layer filled in the trench formed on the element isolating regions of the semiconductor substrate is controlled to 1% or below. Therefore, the invention can provide a method which stabilizes the characteristics of the elements on the element forming regions and produces a highly reliable semiconductor device.

In addition, the invention can provide a highly reliable semiconductor device in that a residual stress in the semiconductor substrate is small and a change of element characteristics with time is little.

What is claimed is:

1. A method of producing a semiconductor device, comprising the steps of:
   forming a trench to provide isolation between a first region and a second region on a semiconductor substrate;
   depositing a first silicon oxide layer having a silicon excess stoichiometry so that the trench of the semiconductor substrate is filled during, or alternately with, a step of etching a portion of the first silicon oxide layer;
   removing the first silicon oxide layer formed on the first region and the second region of the semiconductor substrate; and
   heating the semiconductor substrate so that the excess silicon contained in the first silicon oxide layer is oxidized.

2. A method of producing a semiconductor device as set forth in claim 1, wherein the step of forming the trench forms the trench so that a depth of the trench is greater than a width of the trench.

3. A method of producing a semiconductor device as set forth in claim 1, wherein the step of heating the semiconductor substrate heats the semiconductor substrate so that a volume change of the first silicon oxide layer before and after the heating process is about less than 1%.

4. A method of producing a semiconductor device as set forth in claim 1, wherein the first silicon oxide layer is formed by a CVD method using an $SiH_4$ gas as a material gas.

5. A method of producing a semiconductor device as set forth in claim 1, wherein the step of removing the first silicon oxide layer which is formed on the first region and the second region of the semiconductor substrate is performed by a chemical mechanical polishing method.

6. A method of producing a semiconductor device, comprising the steps of:
   forming a trench to provide isolation between a first region and a second region on a semiconductor substrate;
   depositing a lamination layer of a first silicon oxide layer having a silicon excess stoichiometry and a second silicon oxide layer having an equilibrium stoichiometry on the semiconductor substrate so that the trench of the semiconductor substrate is filled;
   removing the first silicon oxide layer and the second silicon oxide layer formed on the first region and the second region of the semiconductor substrate; and
   heating the semiconductor substrate so that the excess silicon contained in the first silicon oxide layer is oxidized.

7. A method of producing a semiconductor device as set forth in claim 6, wherein the step of forming the trench forms the trench so that a depth of the trench is greater than a width of the trench.

8. A method of producing a semiconductor device as set forth in claim 6, wherein the step of depositing the second silicon oxide layer deposits a hydrated silicon oxide layer.

9. A method of producing a semiconductor device as set forth in claim 6, wherein the step of depositing the second silicon oxide layer deposits the second silicon oxide layer so that a water content of the second silicon oxide layer is less than 1%.

10. A method of producing a semiconductor device as set forth in claim 6, wherein an oxygen to oxidize the excess silicon contained in the first silicon oxide layer in the heating step is supplied by diffusing the second silicon oxide layer.

11. A method of producing a semiconductor device as set forth in claim 6, wherein an oxygen to oxidize the excess silicon contained in the first silicon oxide layer in the heating step is supplied by the hydrated water contained in the second silicon oxide layer.

12. A method of producing a semiconductor device as set forth in claim 6, wherein the step of removing the first silicon oxide layer and the second silicon oxide layer formed on the first region and the second region of the semiconductor substrate is performed by a chemical mechanical polishing method.

13. A method of producing a semiconductor device as set forth in claim 1, wherein an overhang of the first silicon oxide layer, formed around the opening of the trench, is etched before the step of depositing the first silicon oxide layer is completed.

14. A method of producing a semiconductor device as set forth in claim 1, wherein a bias power is applied during the step of depositing the fist silicon oxide layer.

15. A method of producing a semiconductor device as set forth in claim 1, wherein the steps of depositing the first silicon oxide layer and etching the first silicon oxide layer are alternately performed until the trench is filled with the first silicon oxide layer.

* * * * *